United States Patent [19]

Katz

[11] 4,113,524

[45] Sep. 12, 1978

[54] METHOD OF ASSEMBLING COMPONENTS ON PRINTED CIRCUIT BOARDS

[75] Inventor: George Katz, Philadelphia, Pa.

[73] Assignee: RCA Corporation, New York, N.Y.

[21] Appl. No.: 771,679

[22] Filed: Feb. 24, 1977

[51] Int. Cl.² ............................................. B23K 35/34
[52] U.S. Cl. ..................................................... 148/23
[58] Field of Search ....................... 228/207, 108, 170; 148/23-25

[56] References Cited

U.S. PATENT DOCUMENTS

| | | | |
|---|---|---|---|
| 1,083,828 | 1/1914 | Hammar | 148/23 |
| 2,266,060 | 12/1941 | Miller | 148/23 |
| 2,277,064 | 3/1942 | Bialosky | 148/23 |
| 3,622,383 | 11/1971 | Dane | 148/25 |
| 3,734,791 | 5/1973 | Poliak | 148/23 |

*Primary Examiner*—P. D. Rosenberg
*Attorney, Agent, or Firm*—H. Christoffersen; Birgit E. Morris

[57] ABSTRACT

An improved method of assembling components on printed circuit boards whereby trimmed component leads are placed into holes in the printed circuit board, and an extrudable, non-flowing, heat resistant, completely water soluble mixture is applied over and around the components to keep them in place. The components are then soldered to the board and the extrudable mixture washed away with water. The mixture is made from a solid polyalkylene glycol, an alkali metal soap, glycerine and water.

5 Claims, No Drawings

METHOD OF ASSEMBLING COMPONENTS ON PRINTED CIRCUIT BOARDS

This invention relates to a method of assembling components on printed circuit boards. More particularly, this invention relates to a method of soldering components on printed circuit boards which avoids lead clinching.

BACKGROUND OF THE INVENTION

In a general method of assembling components on printed circuit boards, the component leads are mounted through holes punched in the board for that purpose and the leads are then clinched, or bent, to hold the components in place during subsequent fluxing, lead cutting and soldering operations. The leads are soldered to the boards and the excess leads cut off. In many cases, the cut lead ends must then be re-soldered to cover them. These operations require hand labor and many steps, which of course is expensive. Also, solder is lost on the discarded lead ends. Further, when a double soldering step is required, the danger of board warpage, due to the high temperatures involved in soldering, is increased.

With the increased complexity of electronic devices, more components are mounted on the boards, which creates more problems. The clinched leads on the boards interfere with each other, necessitating a stepwise component mounting whereby part of the components are assembled, soldered and their leads cut off before mounting additional components.

Further, it is more difficult to remove faulty components which must be replaced or repaired when the leads have been clinched, without damaging the board or other adjacent components. Still further, access to both sides of the board is required.

Thus other ways of assembling printed circuit board components without clinching leads have been sought. U.S. Pat. Nos. 2,973,499 and 3,230,612 describe adaptors or griplets which are fitted into the board holes and which receive the lead ends and pinch or grip them to hold them in place. However, these methods require additional steps and parts which also add to the expense of manufacture.

U.S. Pat. No. 3,540,718 describes a component clamp and assembly jig whereby a sliced compressible pad, as of plastic foam, is pressed against the components to keep them in place during the soldering and lead cutting steps. This method is not entirely satisfactory either because it is difficult to maintain a uniform pressure against all components which may differ greatly in size and weight. Also, the pad tends to become impregnated with flux and solder after several operations and requires extensive cleaning to retain its resiliency.

Other means of holding the components down by means of pressure have also been tried. When all of the components are of near uniform size and weight, a bag loaded with small particles, e.g. beans or plastic shot, placed over the components will help keep them in place. However, this method also is unsatisfactory when both large and small components must be assembled in close proximity to each other, because the smaller components will not be held down properly and they may become loosened or even dislodged during soldering.

According to another method that has been tried, a molten wax coating is applied to the bottom of the board after the component leads have been inserted into the holes. After the wax cools and hardens, it holds the components in place while the leads are cut and soldered. This method has several advantages; it is particularly adaptable to automatic soldering operations, and the leads can be cut prior to soldering, so that solder covers all the lead ends in one operation. In addition, the wax acts as a flux for the soldering operation. The problems with the existing wax material are that the wax must be removed either with organic solvents, which poses storage and disposal problems, or with hot water, which requires a temperature of over 150° F. which is expensive. In some instances also the soldering efficiency of the wax is inadequate for automated soldering operations, necessitating the application of a second flux over the wax coating.

Thus it would be desirable to provide an improved method of assembling components that will maintain unclinched components in place during soldering operations.

SUMMARY OF THE INVENTION

Extrudable, non-flowing, completely water soluble, low cost compositions have been found that can be readily applied over the components assembled on printed circuit boards and that will maintain the components in place on the board without clinching leads during soldering operations, comprised of a solid polyalkylene glycol, a water soluble, nonionic, surface active agent and a hygroscopic agent. These ingredients can be mixed with water to obtain a non-flowing viscosity which can be extruded at room temperature.

DETAILED DESCRIPTION OF THE INVENTION

The polyalkylene glycols suitable for use in the invention are polymers having the generalized formula

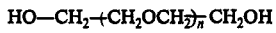

$$HO-CH_2-(CH_2OCH_2)_n-CH_2OH$$

wherein $n$ is an integer. Those having molecular weights above about 600 and up to about 6000 are useful herein and are waxy solids. Those having molecular weights of about 3000 to about 4000 are presently preferred. These waxes cannot be employed alone, however, because they are brittle when cool and they flow at the temperatures of about 150° F. encountered during soldering operations.

Thus a water soluble, nonionic surface active agent is added to improve temperature resistance. Suitable materials are soaps such as alkali metal oleates, stearates, laureates and the like. The soaps should be nonionic and pure enough so that no alkaline or acidic residues are present which may react with the copper conductors on the printed circuit boards or with any of the components. Commercially available sodium silicate soaps and zinc stearate soaps, for example, are too alkaline and may stain or corrode the board surfaces.

A hygroscopic agent is added as a plasticizer to decrease the brittleness of the polyalkaline glycol soap mixture. Glycerin, or 1,2,3-propanetriol, is compatible with the other ingredients, is hygroscopic and is totally water soluble and is an excellent material for use herein.

Water is then added to obtain the desired consistency. The mixture should be readily extrudable at room temperature, and may sag into the spaces between the components on the printed circuit board but should not flow into the lead holes, where it could interfere with subsequent soldering operations.

The ingredients are stirred thoroughly together to form a thick, foamy, extrudable mass that does not flow, even at temperatures on the order of about 150° F. and higher, to which the boards are subjected prior to soldering operations.

The mixtures can be applied by extruding, as from a hand gun, over and around the mounted components. The mixtures do not flow into the lead holes, even after standing for several days, or when processed through a soldering operation which produces board surface temperatures of about 150° F. or higher. The mixtures are storable for long periods.

These mixtures have the additional advantage that they are completely water soluble and are readily removed after soldering by a water rinse, without staining or corroding the printed circuit board surface or the components mounted thereon.

The exact proportions of the several ingredients are not critical. For 100 parts by weight of polyalkylene glycol, from about 10 to about 30 parts by weight of a soap and from about 10 to about 30 parts by weight of glycerin can be employed. The amount of water added is generally from about 10 to about 100 parts per 100 parts by weight of polyalkylene glycol.

These mixtures do not flow into the lead holes even after standing for several days and there is no interference with soldering operations. They are easily applied; they are soft enough so they do not dislodge the components during application and they set up firmly enough to hold the components in place during the soldering steps; and they are completely water soluble, leaving no contamination on the printed circuit board surface or its components. They are low in cost, biodegradable, simple and inexpensive to prepare and to apply from readily available ingredients.

In the described method of soldering components to printed circuit boards, whereby the foregoing mixtures are applied to the mounted components, the components soldered and the mixture washed away, an added advantage is that the component leads may be pre-trimmed to a uniform length prior to mounting on the boards, thus obviating the need for cutting leads after the components are mounted.

The invention will be further illustrated by the following Examples but it is to be understood that the invention is not to be limited to the details described therein. In the Examples all parts are by weight.

EXAMPLE 1

A mixture was made of 100 parts of polyethylene glycol having a molecular weight of about 3700, 20 parts of sodium oleate, 20 parts of glycerin and 60 parts of water. The mixture was whipped together to form a non-flowing, room temperature extrudable mixture which successfully held down variously sized components with pre-cut leads on printed circuit boards during fluxing, pre-heating and soldering operations. Even after standing for several days, this mixture was completely removed by a warm water spray rinse.

EXAMPLE 2

Washed printed circuit boards processed as in Example 1 were soaked in distilled water for one hour and the conductivity of the solution measured. Distilled water was also measured as a control. The conductivity of the two solutions differed by less than 0.2 grains per gallon (1 grain per gallon is equivalent to 17.1 parts per million of chloride ion). This shows that no corrosive material remained on the printed circuit board.

What is claimed is:

1. An extrudable, non-flowing, water soluble composition comprising 100 parts by weight of a solid polyalkylene glycol, from about 10 to about 30 parts by weight of soap, from about 10 to about 30 parts by weight of glycerin and from about 10 to about 100 parts by weight of water.

2. A composition according to claim 1 wherein said polyalkylene glycol is polyethylene glycol having a molecular weight of from about 600 to about 6000.

3. A composition according to claim 2 wherein said polyethylene glycol has a molecular weight of about 3000 to 4000.

4. A composition according to claim 1 wherein said soap is sodium oleate.

5. A composition according to claim 1 containing about 20 parts of sodium oleate, about 20 parts of glycerin and about 60 parts of water.

* * * * *